US012625194B2

(12) United States Patent
Guffond et al.

(10) Patent No.: US 12,625,194 B2
(45) Date of Patent: May 12, 2026

(54) DEVICE AND METHOD FOR MEASURING SPACE CHARGE IN AN ELECTRIC CABLE SPECIMEN

(71) Applicant: NEXANS, Courbevoie (FR)

(72) Inventors: Raphaël Guffond, Lyons (FR);
Baptiste Meneguzzo, Lyons (FR)

(73) Assignee: NEXANS, Courbevoie (FR)

( * ) Notice: Subject to any disclaimer, the term of this patent is extended or adjusted under 35 U.S.C. 154(b) by 203 days.

(21) Appl. No.: 18/384,943

(22) Filed: Oct. 30, 2023

(65) Prior Publication Data

US 2024/0159841 A1 May 16, 2024

(30) Foreign Application Priority Data

Nov. 2, 2022 (FR) ...................................... 22 11410

(51) Int. Cl.
*G01R 31/58* (2020.01)
*G01R 31/52* (2020.01)

(52) U.S. Cl.
CPC ............. *G01R 31/58* (2020.01); *G01R 31/52* (2020.01)

(58) Field of Classification Search
CPC .... G01R 29/24; G01R 29/02; G01R 31/1209; G01R 31/1272; G01R 31/50–60
See application file for complete search history.

(56) References Cited

U.S. PATENT DOCUMENTS

2020/0150171 A1* 5/2020 Mirebeau ........... G01R 31/1209

FOREIGN PATENT DOCUMENTS

| CN | 108181517 A | * | 6/2018 | ............. G01R 29/24 |
| KR | 102028287 B1 | * | 10/2019 | ............. G01R 29/12 |
| WO | WO2022-084434 | | 4/2022 | |

OTHER PUBLICATIONS

French Search Report Dated May 15, 2023.
Zahra et al (Apr. 20, 2022).
Tefferi et al (Sep. 1, 2019).

* cited by examiner

*Primary Examiner* — Lee E Rodak
*Assistant Examiner* — Demetrius R Pretlow
(74) *Attorney, Agent, or Firm* — CANTOR COLBURN LLP

(57) ABSTRACT

A device (10) for measuring space charge in a high-voltage direct current electric cable includes a DC voltage source (12), a voltage step generator (14), a first electrode (16) connected to the DC voltage source (12) and to the voltage step generator (14), a second electrode (18) that is grounded, a piezoelectric sensor (20) connected to the second electrode (18), an electrical-signal amplifier (22) connected to the piezoelectric sensor (20), and at least one specimen (24) of the electric cable placed between the first and second electrodes (16, 18) and including a cut of the cable made to a predetermined depth in the electrical insulation system of the cable. The amplitude of the signal measured at the output of the amplifier (22) is related to the charge density in the specimen (24) and the delay related to the distance of the charges from the piezoelectric sensor (20) giving the position of the charges.

8 Claims, 3 Drawing Sheets

DEVICE AND METHOD FOR MEASURING SPACE CHARGE IN AN ELECTRIC CABLE SPECIMEN

RELATED APPLICATION

This application claims the benefit of priority from French Patent Application No. 22 11410, filed on Nov. 2, 2022, the entirety of which is incorporated by reference.

FIELD OF THE INVENTION

The present invention relates to a device and a method for measuring space charge in an electric cable specimen.

The invention belongs to the field of electric cables intended to transport energy and/or to transmit data. It is particularly applicable to the field of analysing the behaviour of the electrical insulation of high-voltage direct current cables in the event of space charge accumulation.

DESCRIPTION OF THE RELATED ART

In the field of HVDC (high-voltage direct current) cables, validation tests are required not only under DC power, but also to check the behaviour of the electrical insulation system of the cable in the event of space charge accumulation.

Indeed, space charge accumulation is generally considered to be the main factor in speeding up the degradation of the electrical insulation of a cable, in particular the polymeric insulation for HVDC cables, compared to HVAC (high-voltage alternating current) cables. This is due to the amplification of the local electric field produced by the accumulated charge, which leads to an increase in the rate of degradation under direct current conditions.

At present, these validation tests are generally carried out on real electrical insulation systems and on real life-size cables.

For example, the pulsed electro-acoustic (PEA) method is known, which consists in applying a voltage pulse to a material placed between two electrodes. The space charge and the charges at the electrodes in response to this electrical pulse launch acoustic waves that propagate through the material. These waves are detected by a piezoelectric sensor attached to one of the electrodes. The piezoelectric sensor acts as a converter that converts the acoustic signal into an electrical signal. This electrical signal is fed into an amplifier and an oscilloscope in order to acquire an easily measurable signal. The amplitude of the signal measured from the amplifier is related to the charge density and the delay related to the distance of the charges from the sensor gives the position of the charges.

The thermal step method (TSM) is also known, which consists in applying a rapid temperature variation to the cable. Thermal diffusion leads to a local variation in permittivity and a local expansion of the cable. The space charge in response to these changes creates a measurable current.

These known techniques require considerable time investments and are highly costly. Furthermore, during such measurements, it is often difficult to decorrelate the space charge signal from the noise coming from the environment of the cables.

OBJECTS AND SUMMARY

The present invention aims to rectify the abovementioned drawbacks of the prior art.

To this end, the present invention proposes a device for measuring space charge in a high-voltage direct current electric cable, comprising:

- a DC voltage source;
- a voltage step generator;
- a first electrode connected to the DC voltage source and to the voltage step generator;
- a second electrode that is grounded;
- a piezoelectric sensor connected to the second electrode;
- an electrical-signal amplifier connected to the piezoelectric sensor;
- the device being noteworthy in that it furthermore comprises at least one specimen of the electric cable placed between the first and second electrodes and consisting of a cut of the cable made to a predetermined depth in the electrical insulation system of the cable, the amplitude of the signal measured at the output of the amplifier being related to the charge density in the at least one specimen and the delay related to the distance of the charges from the piezoelectric sensor giving the position of the charges in the at least one specimen.

Thus, by virtue of a simple and inexpensive electrical circuit, the present invention makes it possible to carry out laboratory validation tests on cable cuts made to predetermined depths in the insulation system, more quickly and more economically than in the field.

Moreover, knowing that the measurement is carried out not on the cable in its noisy environment but on a specimen, the problem of decorrelating the space charge signal from the noise coming from the environment of the cables does not arise.

In one particular embodiment, the device comprises a plurality of specimens of the electric cable that are placed successively individually between the first and second electrodes and consisting of cuts of the cable that are made to a plurality of predetermined depths in the electrical insulation system of the cable.

This makes it possible to take into consideration the influence of the temperature gradient and electric field gradient in the space charge accumulation of the electrical insulation system of the cable.

In one particular embodiment, the device furthermore comprises an impedance-matching resistor connected between the voltage step generator and the first electrode.

This makes it possible to optimize the transmission of the voltage signal between the voltage step generator and the first electrode.

In one particular embodiment, the device furthermore comprises a decoupling capacitor connected between the voltage step generator and the first electrode.

This makes it possible to electrically protect the voltage step generator from the DC voltage applied in parallel to the specimen.

In one particular embodiment, the device furthermore comprises a current-limiting resistor connected between the DC voltage source and the first electrode.

This resistor provides electrical protection for the first electrode.

In one particular embodiment, the device furthermore comprises a first carbon black-filled silicone rubber layer arranged between the first electrode and the at least one specimen and a second carbon black-filled silicone rubber layer arranged between the second electrode and the at least one specimen.

The electrodes thus have the advantage of adhering well to the specimen and of having good electrical conductivity over the entire measured temperature range.

In one particular embodiment, the piezoelectric sensor is a polyvinylidene fluoride sensor.

Specifically, this polymer, having ferroelectric properties, is capable of creating an electrical signal in response to an acoustic wave.

In one particular embodiment, the at least one specimen comprises crosslinked polyethylene.

Crosslinked polyethylene is an insulating substance in the case of which the device is specifically particularly suitable for measuring space charge.

For the same purpose as that indicated above, the present invention also proposes a method for measuring space charge in a high-voltage direct current electric cable by way of a device as briefly described above, which method is noteworthy in that it comprises the following steps:

obtaining the at least one specimen by removing a cut of cable to a predetermined depth of the electric cable in the electrical insulation system of the cable and placing the at least one specimen between the first and second electrodes;

applying a DC voltage to the first electrode by way of the DC voltage source;

applying a voltage pulse to the first electrode by way of the voltage step generator;

by way of the piezoelectric sensor, detecting an acoustic signal, converting this acoustic signal into an electrical signal and supplying this electrical signal to the amplifier, the amplitude of the signal measured at the output of the amplifier being related to the charge density in the at least one specimen and the delay related to the distance of the charges from the piezoelectric sensor giving the position of the charges in the at least one specimen.

Since the particular features and the advantages of the method are similar to those of the device, they are not repeated here.

BRIEF DESCRIPTION OF THE DRAWINGS

Other aspects and advantages of the invention will become apparent on reading the detailed description below of particular embodiments, which are given by way of entirely non-limiting examples, with reference to the appended drawings, in which.

DESCRIPTION OF EMBODIMENT(S)

Figure 1:
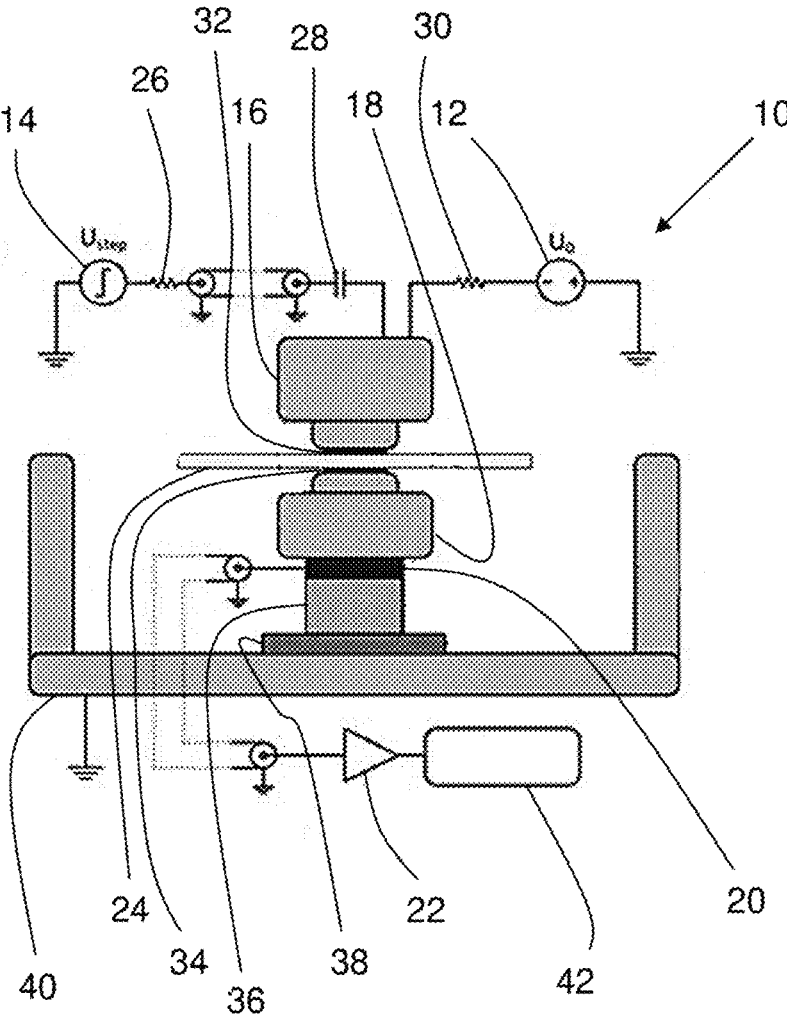
FIG. 1 is a schematic depiction of a device according to the present invention, in one particular embodiment.

The circuit diagram of FIG. 1 shows a device 10 according to the present invention, for measuring space charge in a high-voltage direct current electric cable, in one particular embodiment. The invention is applicable in particular, but not solely, to HVDC cables subjected to voltages that may reach 800 kV.

The device 10 comprises a DC voltage source 12, one terminal of which is grounded. By way of non-limiting example, the DC voltage source 12 may deliver a DC voltage $U_0$ of ±65 kV.

The device 10 also comprises a voltage step generator 14, one terminal of which is grounded, and which delivers a voltage step $U_{step}$.

The device 10 also comprises a first electrode 16, which is a high-voltage electrode connected to the DC voltage source 12 and to the voltage step generator 14. The device 10 also comprises a second electrode 18 that is grounded.

By way of non-limiting example, the first and second electrodes 16, 18 may comprise aluminium.

The device 10 moreover comprises a piezoelectric sensor 20 connected to the second electrode 18.

By way of non-limiting example, the piezoelectric sensor 20 may be a polyvinylidene fluoride sensor and may have a thickness of 28 μm.

Optionally, the device 10 may furthermore comprise, on the side of the piezoelectric sensor 20 opposite the second electrode 18, a layer 36 of conductive material arranged between the piezoelectric sensor 20, on the one hand, and a layer 38 of elastomer, itself placed on a support 40 that is grounded, on the other hand.

The device 10 furthermore comprises an electrical-signal amplifier 22 that is connected to the piezoelectric sensor 20 and grounded.

Optionally, in order to facilitate the display of the measured signals, the device may furthermore comprise an oscilloscope 42 connected to the output of the electrical-signal amplifier 22.

According to the present invention, the device 10 furthermore comprises at least one specimen 24 of the electric cable placed between the first electrode 16 and the second electrode 18. The at least one specimen 24 consists of a cut of the cable made to a predetermined depth in the electrical insulation system of the cable.

By way of non-limiting example, the at least one specimen 24 may comprise crosslinked polyethylene.

By way of non-limiting example, the at least one specimen 24 may have a length of 70 mm.

The amplitude of the signal measured at the output of the amplifier 22 is related to the charge density in the at least one specimen and the delay related to the distance of the charges from the piezoelectric sensor 20 gives the position of the charges in the at least one specimen. The device 10 thus makes it possible to measure the space charge in the at least one specimen 24 of the electric cable.

The device 10 may comprise a single specimen 24, or a plurality of specimens 24 of the electric cable, which will be placed successively individually between the first electrode 16 and the second electrode 18 and which each consist of a cut of the cable made to a predetermined different depth in the electrical insulation system of the cable.

Optionally, the device 10 may furthermore comprise an impedance-matching resistor 26 that is connected between the voltage step generator 14 and the first electrode 16 and also grounded. By way of non-limiting example, the impedance-matching resistor 26 may have a value of 50Ω.

Optionally, the device 10 may furthermore comprise a decoupling capacitor 28 connected between the voltage step generator 14 and the first electrode 16.

Optionally, the device 10 may furthermore comprise a current-limiting resistor 30 connected between the DC voltage source 12 and the first electrode 16.

By way of non-limiting example, the current-limiting resistor 30 may have a value of 100 MΩ.

Optionally, the device 10 may furthermore comprise a first carbon black-filled silicone rubber layer 32 arranged between the first electrode 16 and the at least one specimen 24 and a second carbon black-filled silicone rubber layer 34 arranged between the second electrode 18 and the at least one specimen 24.

By way of non-limiting example, when the at least one specimen 24 has a length of 70 mm, the carbon black-filled silicone rubber layers 32 and 34 may extend over a length of 20 mm.

Figure 2:
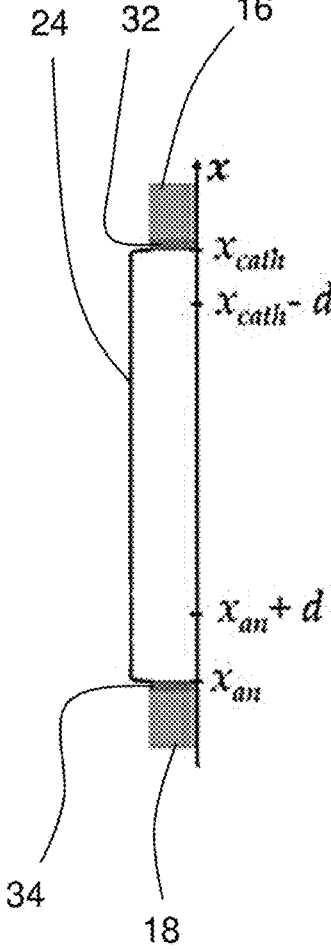
FIG. 2 is a partial schematic depiction of a cable specimen contained in a device according to the present invention, in one particular embodiment.

The partial view of FIG. 2 shows part of the at least one specimen 24, as well as the x-axis of the depth in this specimen. $x_{cath}$ designates the depth of the specimen 24 in contact with the cathode, that is to say the first electrode 16, possibly via the first carbon black-filled silicone rubber layer 32, and $x_{an}$ designates the depth of the specimen 24 in contact with the anode, that is to say the second electrode 18, possibly via the second carbon black-filled silicone rubber layer 34.

If it is desired to measure only the space charge in the specimen 24, without the charge at the first and second electrodes 16, 18, a distance d is chosen so as to measure the space charge between the depths $x_{cath}$–d and $x_{an}$+d. By way of non-limiting example, d=75 μm may be chosen.

Figure 3:
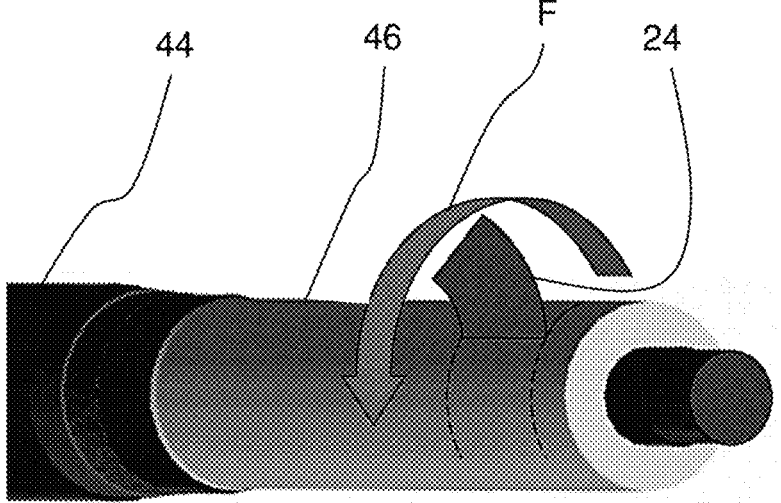
FIG. 3 is a schematic depiction of a step of removing a cut of cable as part of a method according to the present invention, in one particular embodiment.

As shown in FIG. 3, the method according to the present invention for measuring space charge in a high-voltage direct current electric cable by way of the device 12 comprises a first step consisting in obtaining the at least one specimen 24 by removing a cut of cable to a predetermined depth of the electric cable 44 in the electrical insulation system 46 of the cable. The arrow F indicates the direction of cutting in one particular embodiment. The removed specimen 24 is placed between the first and second electrodes 16 and 18.

The next step consists in applying the DC voltage $U_0$ to the first electrode 16 by way of the DC voltage source 12.

The voltage pulse $U_{step}$ is then applied to the first electrode 16 by way of the voltage step generator 14.

Next, when the piezoelectric sensor 20 detects an acoustic signal, it converts this acoustic signal into an electrical signal and supplies this electrical signal to the amplifier 22. The amplitude of the signal measured at the output of the amplifier 22 and possibly displayed on the oscilloscope 42 is related to the charge density in the at least one specimen 24 and the delay related to the distance of the charges from the piezoelectric sensor 20 gives the position of the charges in the at least one specimen 24.

Before a cable system is put on the market, what are known as prequalification tests are carried out in order to demonstrate the long-term performance of the cable system, as well as what are known as type tests, in order to demonstrate its good performance specific to a given use. In line with the CIGRE (Conseil International des Grands Roseaux Electriques, International Council on Large Electric Systems) recommendations, the prequalification tests consist in particular in subjecting the cable system to electrical and thermal stress for one year, and the type tests consist in particular in subjecting the cable system to electrical and thermal stress for one month.

The space charge may be measured by way of the device 10 before and after the prequalification test and/or the type test, in order to monitor the evolution of the space charge caused by these tests and to ascertain the impact of the ageing of the cable system. Moreover, the space charge may be measured at various temperatures and for various values of the electric field.

The invention claimed is:

1. A device for measuring space charge in a high-voltage direct current electric cable, comprising:
   a DC voltage source;
   a voltage step generator;
   a first electrode connected to said DC voltage source and to said voltage step generator;
   a second electrode that is grounded;
   a piezoelectric sensor connected to said second electrode; and
   an electrical-signal amplifier connected to said piezoelectric sensor;
   wherein said device further comprises a plurality of specimens of said electric cable that are placed successively individually between said first and second electrodes and including cuts of said cable made to a plurality of predetermined depths in an electrical insulation system of said cable, an amplitude of the signal measured at the output of said amplifier being related to a charge density in said at least one specimen and a delay related to a distance of charges from said piezoelectric sensor giving the position of the charges in said at least one specimen.

2. The device according to claim 1, wherein said device further comprises an impedance-matching resistor connected between said voltage step generator and said first electrode.

3. The device according to claim 1, wherein said device further comprises a decoupling capacitor connected between said voltage step generator and said first electrode.

4. The device according to claim 1, wherein said device further comprises a current-limiting resistor connected between said DC voltage source and said first electrode.

5. The device according to claim 1, wherein said device further comprises a first carbon black-filled silicone rubber layer arranged between said first electrode and said at least one specimen and a second carbon black-filled silicone rubber layer arranged between said second electrode and said at least one specimen.

6. The device according to claim 1, wherein said piezoelectric sensor is a polyvinylidene fluoride sensor.

7. The device according to claim 1, wherein said at least one specimen comprises crosslinked polyethylene.

8. A method for measuring space charge in a high-voltage direct current electric cable by way of a device according to claim 1, said method comprises the following steps:
   obtaining said plurality of specimens by removing cuts of the cable to a plurality of predetermined depths of said electric cable in an electrical insulation system of said cable and successively and individually placing said plurality of specimens between said first and second electrodes;
   applying a DC voltage to said first electrode by way of said DC voltage source;
   applying a voltage pulse to said first electrode by way of said voltage step generator;
   by way of said piezoelectric sensor, detecting an acoustic signal, converting said acoustic signal into an electrical signal and supplying said electrical signal to said amplifier, an amplitude of the signal measured at the output of said amplifier being related to a charge density in said plurality of specimens and a delay related to a distance of charges from said piezoelectric sensor giving the position of the charges in said plurality of specimens.

\* \* \* \* \*